United States Patent
Sakurai et al.

(10) Patent No.: US 12,256,560 B1
(45) Date of Patent: Mar. 18, 2025

(54) IGBT WITH ELECTRIC FIELD RELAXATION DOPING PROFILE

(71) Applicant: FUJI ELECTRIC CO., LTD., Kanagawa (JP)

(72) Inventors: Yosuke Sakurai, Azumino (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/603,082

(22) Filed: Mar. 12, 2024

Related U.S. Application Data

(63) Continuation of application No. 17/409,819, filed on Aug. 24, 2021, now Pat. No. 11,942,535, which is a
(Continued)

(30) Foreign Application Priority Data

Sep. 13, 2019 (JP) .................. 2019-167090

(51) Int. Cl.
*H01L 29/739* (2006.01)
*H01L 29/06* (2006.01)
(Continued)

(52) U.S. Cl.
CPC ......... *H10D 12/461* (2025.01); *H10D 62/102* (2025.01); *H10D 62/127* (2025.01)

(58) Field of Classification Search
CPC ............. H01L 29/7396; H01L 29/0607; H01L 29/0696
See application file for complete search history.

(56) References Cited

U.S. PATENT DOCUMENTS 10,297,660 B2   5/2019   Naito
10,707,300 B2   7/2020   Sakurai
(Continued)

FOREIGN PATENT DOCUMENTS

CN   101694850 A   4/2010
CN   109075202 A   12/2018
(Continued)

OTHER PUBLICATIONS

International Search Report and (ISA/237) Written Opinion of the International Search Authority for International Patent Application No. PCT/JP2020/032871, mailed by the Japan Patent Office on Nov. 17, 2020.
(Continued)

*Primary Examiner* — J. E. Schoenholtz

(57) ABSTRACT

Provided is a semiconductor device that includes a drift region that is of a first conductivity type and is provided in a semiconductor substrate; a base region that is of a second conductivity type and is provided above the drift region; an accumulation region that is of the first conductivity type provided between the base region and the drift region; and an electric field relaxation region that is provided between the base region and the accumulation region, wherein the boundary between the electric field relaxation region and the accumulation region is a location for a half-value for the peak of the doping concentration of the accumulation region, and an integrated concentration of the electric field relaxation region is greater than or equal to $5E14$ cm$^{-2}$ and less than or equal to $5E15$ cm$^{-2}$.

18 Claims, 14 Drawing Sheets

Related U.S. Application Data continuation of application No. PCT/JP2020/032871, filed on Aug. 31, 2020.

(51) Int. Cl.
*H10D 12/00* (2025.01)
*H10D 62/10* (2025.01)

(56) References Cited

U.S. PATENT DOCUMENTS

| | | | |
|---|---|---|---|
| 11,942,535 B2 * | 3/2024 | Sakurai | ............... H01L 29/0696 |
| 2005/0263853 A1 | 12/2005 | Tomomatsu | |
| 2007/0267663 A1 | 11/2007 | Harada | |
| 2008/0197379 A1 | 8/2008 | Aono | |
| 2014/0339600 A1 | 11/2014 | Yoshikawa | |
| 2018/0069075 A1 | 3/2018 | Naito | |
| 2018/0138299 A1 | 5/2018 | Naito | |
| 2018/0301550 A1 | 10/2018 | Sakurai | |
| 2018/0350961 A1 | 12/2018 | Naito | |
| 2019/0074367 A1 | 3/2019 | Naito | |
| 2019/0237545 A1 | 8/2019 | Suzuki | |
| 2019/0312101 A1 | 10/2019 | Sakurai | |
| 2020/0152778 A1 | 5/2020 | Naito | |

FOREIGN PATENT DOCUMENTS

| | | | |
|---|---|---|---|
| JP | 2005347289 | A | 12/2005 |
| JP | 2007311627 | A | 11/2007 |
| JP | 2008205015 | A | 9/2008 |
| JP | 2018041845 | A | 3/2018 |
| JP | 2018190948 | A | 11/2018 |
| JP | 2019186311 | A | 10/2019 |
| WO | 2018016543 | A1 | 1/2018 |
| WO | 2018030440 | A1 | 2/2018 |
| WO | 2019142706 | A1 | 7/2019 |

OTHER PUBLICATIONS

Office Action issued for counterpart Japanese Application No. 2021-545226, issued by the Japanese Patent Office on Oct. 4, 2022 (drafted on Sep. 22, 2022).
Those references were submitted as IDS or found by the examiner over the earlier U.S. Appl. No. 17/409,819, filed Aug. 24, 2021.
Office Action issued for related Chinese Application 202080017821.X, issued by The State Intellectual Property Office of People's Republic of China on Jun. 28, 2024.
Office Action issued for related German Application 112020000621.2, transmitted from the German Patent and Trademark Office on Nov. 29, 2024 (issued on Nov. 28, 2024).

* cited by examiner

| PEAK CONCENTRATION $(cm^{-3})$ OF ACCUMULATION | FILM THICKNESS W ($\mu$m) OF ELECTRIC FIELD | INTEGRATED CONCENTRATION $(cm^{-2})$ OF ELECTRIC |
|---|---|---|
| 1.00E+16 | 0.4 | 7.10E+14 |
| 2.50E+16 | 1 | 1.40E+15 |
| 3.00E+16 | 1.3 | 1.72E+15 |
| 4.00E+16 | 1.8 | 2.98E+15 |
| 5.00E+16 | UNAVAILABLE | UNAVAILABLE |

*FIG. 4C*

IGBT WITH ELECTRIC FIELD RELAXATION DOPING PROFILE

CROSS-REFERENCE TO RELATED APPLICATIONS

This application is a continuation of U.S. patent application Ser. No. 17/409,819 filed on Aug. 24, 2021, which is a continuation of International Patent Application PCT/JP2020/032871 filed on Aug. 31, 2020; which claims priority to Japanese Patent Application No. 2019-167090 filed on Sep. 13, 2019, the entirety of the contents of each of which are hereby incorporated herein by reference.

BACKGROUND

1. Technical Field

The present invention relates to a semiconductor device.

2. Related Art

A semiconductor device provided with an accumulation region in a mesa portion between trench portions is known (for example, refer to Patent Documents 1 to 3).

Patent Document 1: Japanese Patent Application Publication No. 2005-347289

Patent Document 2 Japanese Patent Application Publication No. 2008-205015

Patent Document 3: Japanese Patent Application Publication No. 2007-311627

SUMMARY

Suppressing a leakage current in a semiconductor device is desirable.

BRIEF DESCRIPTION OF THE DRAWINGS

FIG. 4C illustrates a relationship between the peak concentration of the accumulation region 16, the film thickness W of the electric field relaxation region 17, and the integrated concentration of the electric field relaxation region 17.

DESCRIPTION OF EXEMPLARY EMBODIMENTS

Description is given below for the present invention by means of embodiments of the invention, but the following embodiments do not limit the invention according to the claims. There is no limitation to all combinations of features described in an embodiment being essential to a means for solving the problems of the invention.

Herein, one direction parallel to the depth direction of a semiconductor substrate is referred to as "up", and the other direction is referred to as "down". In addition, one surface of the two main surfaces of a substrate, a layer, or another member is referred to as a top surface, and the other surface is referred to as a bottom surface. "Up" and "down" directions are not limited by the direction of gravity.

In the present specification, technical matter may be described with reference to X, Y, and Z orthogonal coordinate axes. In the present specification, a plane parallel to the top surface of a semiconductor substrate is referred to as an XY plane, and the depth direction of the semiconductor substrate is referred to as the Z axis.

In each embodiment, description is given for an example in which a first conductivity type is N type and a second conductivity type is P type, but the first conductivity type may be P type and the second conductivity type may be N type. In this case, the respective conductivity types of substrate, layers, regions and the like in each embodiment are respectively opposite polarities.

"Doping concentration" in the present specification indicates the concentration of impurities made to be an acceptor or a donor. The difference in concentration between donors and acceptors may be given as the doping concentration. The peak value of a doping concentration distribution in a doped region may be given as the doping concentration in that doped region.

In the present specification, a layer or region that begins with "N" or "P" means that this layer or region is a majority carrier of electrons or holes, respectively. In addition, "+" and "−" added to N or P respectively mean a higher doping concentration and a lower doping concentration in relation to a layer or region to which "+" or "−" are not added.

Figure 1A:
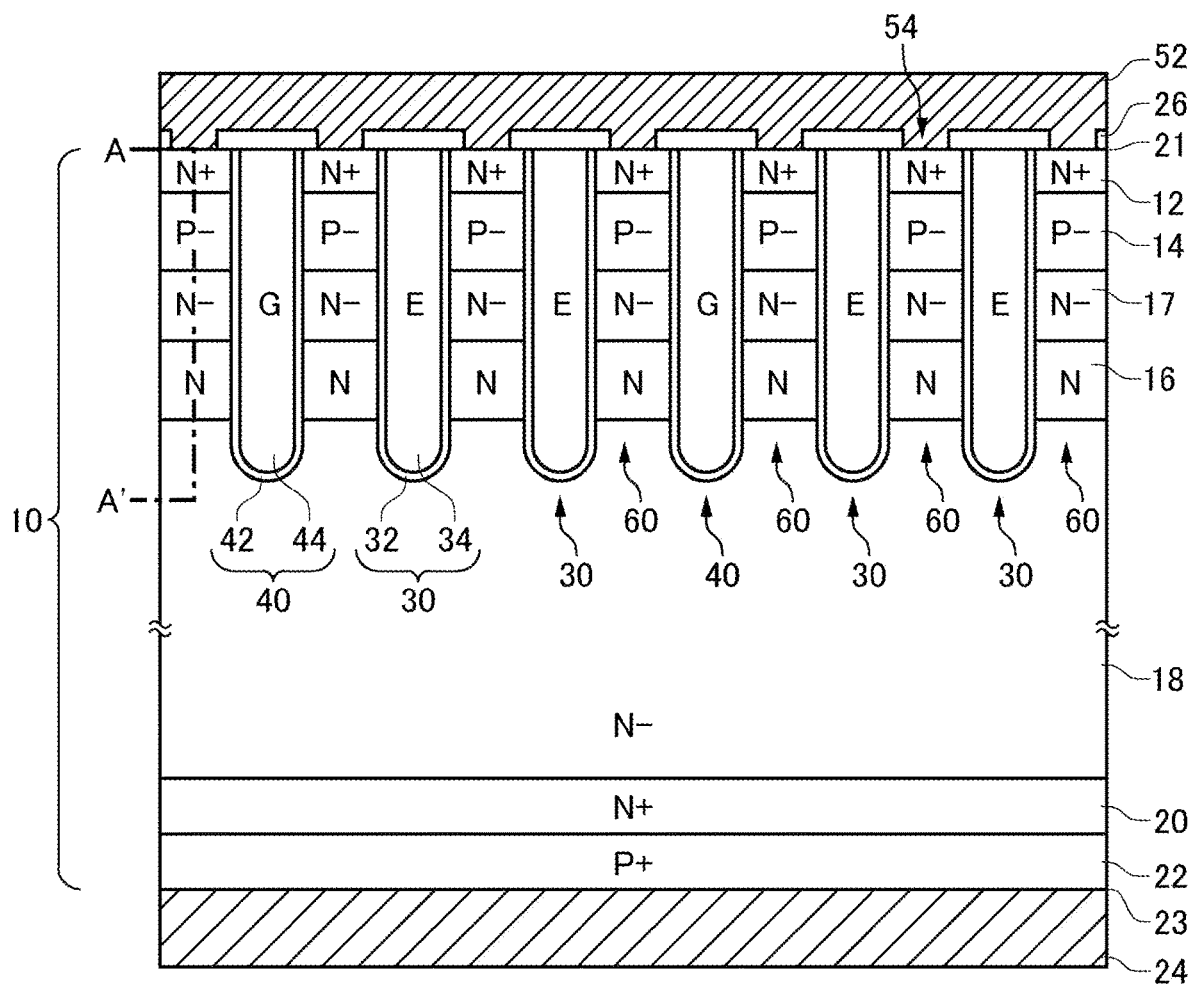
FIG. 1A illustrates an example of a cross-section of a semiconductor device 100 according to an embodiment.

FIG. 1A illustrates an example of a cross-section of a semiconductor device 100 according to an embodiment. Each member illustrated in FIG. 1A is formed extending in a direction that is perpendicular to the paper surface of the drawing. The semiconductor device 100 reduces an ON resistance and an ON voltage in accordance with conductivity modulation. As an example, the semiconductor device 100 is a semiconductor chip that has an insulated gate bipolar transistor (IGBT). In the corresponding cross-section, the semiconductor device 100 of the present example has a semiconductor substrate 10, an insulating film between layers 26, an emitter electrode 52, and a collector electrode 24.

The insulating film between layers 26 is provided on a front surface 21 of the semiconductor substrate 10. The insulating film between layers 26 is, for example, a silicate glass film to which phosphorus has been added (a PSG film), or a silicate glass film to which phosphorus and boron have been added (a BPSG film).

A contact hole 54 is an opening provided in the insulating film between layers 26. The contact hole 54 is provided in order to expose the front surface 21 of the semiconductor substrate 10, and connect the emitter electrode 52 with the front surface 21. The contact hole 54 in the present example is provided in the center of a mesa portion 60, but there is no limitation to this.

The emitter electrode 52 is provided above the front surface 21 of the semiconductor substrate 10. The emitter electrode 52 of the present example is formed on the top surface of the insulating film between layers 26. The emitter electrode 52 may be in contact with some regions of the front surface 21 of the semiconductor substrate 10. The emitter electrode 52 is also formed inside the contact hole 54, and is in contact with emitter regions 12. The insulating film between layers 26 also insulates between the emitter electrode 52 and a gate conductive portion 44.

The collector electrode 24 is provided on a back surface 23 of the semiconductor substrate 10. The emitter electrode 52 and the collector electrode 24 are formed by an electrically-conductive material such as metal. For example, the emitter electrode 52 and the collector electrode 24 may be formed by an electrically-conductive material that includes aluminum. In addition, portions of the emitter electrode 52 and the collector electrode 24 that are formed in fine regions such as within openings in an insulating film may be formed by an electrically-conductive material that includes tungsten.

The semiconductor substrate 10 may be a silicon substrate or a compound semiconductor substrate. The semiconductor substrate 10 may be, for example, a silicon carbide substrate or a nitride semiconductor substrate made of gallium nitride or the like. The semiconductor substrate 10 in the present example is a silicon substrate.

A drift region 18 is a first conductivity type region provided in the semiconductor substrate 10. The drift region 18 in the present example is of the N− type as an example. The drift region 18 may be a remaining region of the semiconductor substrate 10 where another doped region is not formed. In other words, the doping concentration of the drift region 18 may be the doping concentration of the semiconductor substrate 10.

The emitter region 12 is a first conductivity type region provided at the side of the front surface 21 of the semiconductor substrate 10. The emitter region 12 is of the N+ type as an example. The emitter region 12 is provided in contact with a dummy trench portion 30 or a gate trench portion 40. The emitter region 12 is provided, in a mesa portion 60 between adjacent trench portions, extending from one trench portion to the other trench portion.

A base region 14 is a second conductivity type region provided at the side of the front surface 21 of the semiconductor substrate 10. The base region 14 is of the P− type as an example. The base region 14 is provided below the emitter region 12. The base region 14 is also provided above the drift region 18.

An accumulation region 16 is a first conductivity type region provided between the base region 14 and the drift region 18. The accumulation region 16 in the present example is of the N type as an example. The accumulation region 16 is provided in contact with the dummy trench portion 30 or the gate trench portion 40. The doping concentration of the accumulation region 16 is higher than the doping concentration of the drift region 18. The accumulation region 16 increases the carrier density in the top surface side of the drift region 18 by suppressing holes that are implanted into the drift region 18 from the back surface 23 side of the semiconductor substrate 10 from getting through to the front surface 21 side of the semiconductor substrate 10. In this manner, the accumulation region 16 modulates the conductivity of the semiconductor device 100 in accordance with a carrier injection enhancement effect (an IE effect). As a result, the conduction resistance of the semiconductor device 100 decreases, and it is possible to reduce an ON voltage.

An electric field relaxation region 17 is provided between the base region 14 and the accumulation region 16. The top end of the electric field relaxation region 17 is the location of a junction between the base region 14 and the electric field relaxation region 17. The lower end of the electric field relaxation region 17 is a location of a half-value with respect to the peak of the doping concentration of the accumulation region 16. The electric field relaxation region 17 is of the N− type as an example.

The doping concentration of the electric field relaxation region 17 is lower than the peak of the doping concentration of the accumulation region 16. The doping concentration of the electric field relaxation region 17 may be lower than the peak of the doping concentration of the base region 14. In the electric field relaxation region 17, it is possible to make it easier for the depletion layer to expand and relax concentration of the electric field.

In one example, the electric field relaxation region 17 has a region with the same doping concentration as that of the drift region 18. The electric field relaxation region 17 has a region with the same doping concentration as that of the drift region 18, with a predefined film thickness. For example, the electric field relaxation region 17 has a region with the same doping concentration as that of the drift region 18, with a film thickness of 0.5 µm or more.

A film thickness W of the electric field relaxation region 17 is set so that it is possible to suppress a leakage current between C-E when a high voltage is applied. The leakage current between C-E indicates a leakage current for a current Ices that flows between the collector electrode 24 and the emitter electrode 52. In one example, the film thickness W of the electric field relaxation region 17 is set so that the electric field between the accumulation region 16 and the base region 14 is relaxed, and the leakage current is suppressed.

For example, the film thickness W of the electric field relaxation region 17 is greater than or equal to the film thickness of the accumulation region 16. By thickening the film thickness of the electric field relaxation region 17, it is easier to suppress the leakage current. The film thickness W of the electric field relaxation region 17 may be less than or equal to the film thickness of the accumulation region 16. The film thickness W of the electric field relaxation region 17 may be greater than or equal to 0.4 µm and less than or equal to 3.0 µm. The film thickness W of the electric field relaxation region 17 may be greater than or equal to 1.0 µm and less than or equal to 1.8 µm. The film thickness W of the electric field relaxation region 17 may be greater than or equal to 1.5 µm and less than or equal to 2.0 µm.

A buffer region 20 is a first conductivity type region provided below the drift region 18. The buffer region 20 in the present example is of the N+ type as an example. The doping concentration of the buffer region 20 is higher than the doping concentration of the drift region 18. The buffer region 20 may function as a field stop layer that prevents a depletion layer which extends from the bottom surface side of the base region 14 from reaching the collector region 22 which is of the second conductivity type and a cathode region which is of the first conductivity type.

The dummy trench portion 30 and the gate trench portion 40 are arrayed at predefined intervals along a predefined array direction (X axis direction in the present example). The dummy trench portion 30 and the gate trench portion 40 extend along an extension direction (Y axis direction in the present example) that is parallel to the front surface 21 of the semiconductor substrate 10 and is orthogonal to the array direction. The dummy trench portion 30 and the gate trench portion 40 penetrate from the front surface 21 side of the semiconductor substrate 10 through the emitter region 12, the base region 14, the electric field relaxation region 17, and the accumulation region 16, and extend into the drift region 18.

The gate trench portion 40 is set to a gate potential. The gate trench portion 40 has a gate trench and a gate insulating film 42, and the gate conductive portion 44 which are formed in the front surface 21.

The gate insulating film 42 is formed covering the inner wall of the gate trench. The gate insulating film 42 may be formed by oxidizing or nitriding the semiconductor that is the inner wall of the gate trench. The gate insulating film 42 insulates between the gate conductive portion 44 and the semiconductor substrate 10.

The gate conductive portion 44 is formed inside the gate trench, more inside than the gate insulating film 42. The gate conductive portion 44 is formed by an electrically-conductive material such as polysilicon. The gate conductive portion 44 is covered by the insulating film between layers 26 at the front surface 21. The gate conductive portion 44 includes at least a region that faces adjacent base regions 14. When a predefined voltage is applied to the gate conductive portion 44, a channel is formed in the surface layer of, out of the base region 14, an interface that is in contact with the gate trench portion 40. The gate conductive portion 44 of the present example has a portion that protrudes on the back surface 23 side of the semiconductor substrate 10 beyond the bottom surface of the accumulation region 16.

The dummy trench portion 30 is set to an emitter potential. The dummy trench portion 30 has a dummy trench formed at the front surface 21 side, a dummy insulating film 32, and a dummy conductive portion 34.

The dummy insulating film 32 is formed covering the inner wall of the dummy trench. The dummy insulating film 32 may be formed by oxidizing or nitriding the semiconductor that is the inner wall of the dummy trench. The dummy insulating film 32 insulates between the dummy conductive portion 34 and the semiconductor substrate 10.

The dummy conductive portion 34 is formed inside the dummy trench, more inside than the dummy insulating film 32. The dummy conductive portion 34 is formed by an electrically-conductive material such as polysilicon. The dummy conductive portion 34 is covered by the insulating film between layers 26 at the front surface 21.

The semiconductor device 100 of the present example is provided with a structure in which one gate trench portion 40 and two dummy trench portions 30 are repeatedly arrayed in this order. The array structure for trench portions is not limited to the present example. A plurality of gate trench portions 40 may be contiguously disposed. One dummy trench portion 30 may be disposed sandwiched between two gate trench portions 40. The semiconductor device 100 may be provided with only the gate trench portion 40 as a trench portion.

A mesa portion 60 is a region of the semiconductor substrate 10 that is sandwiched between two trench portions. The emitter region 12, the base region 14, the electric field relaxation region 17, and the accumulation region 16 are provided in the mesa portion 60.

Figure 1B:
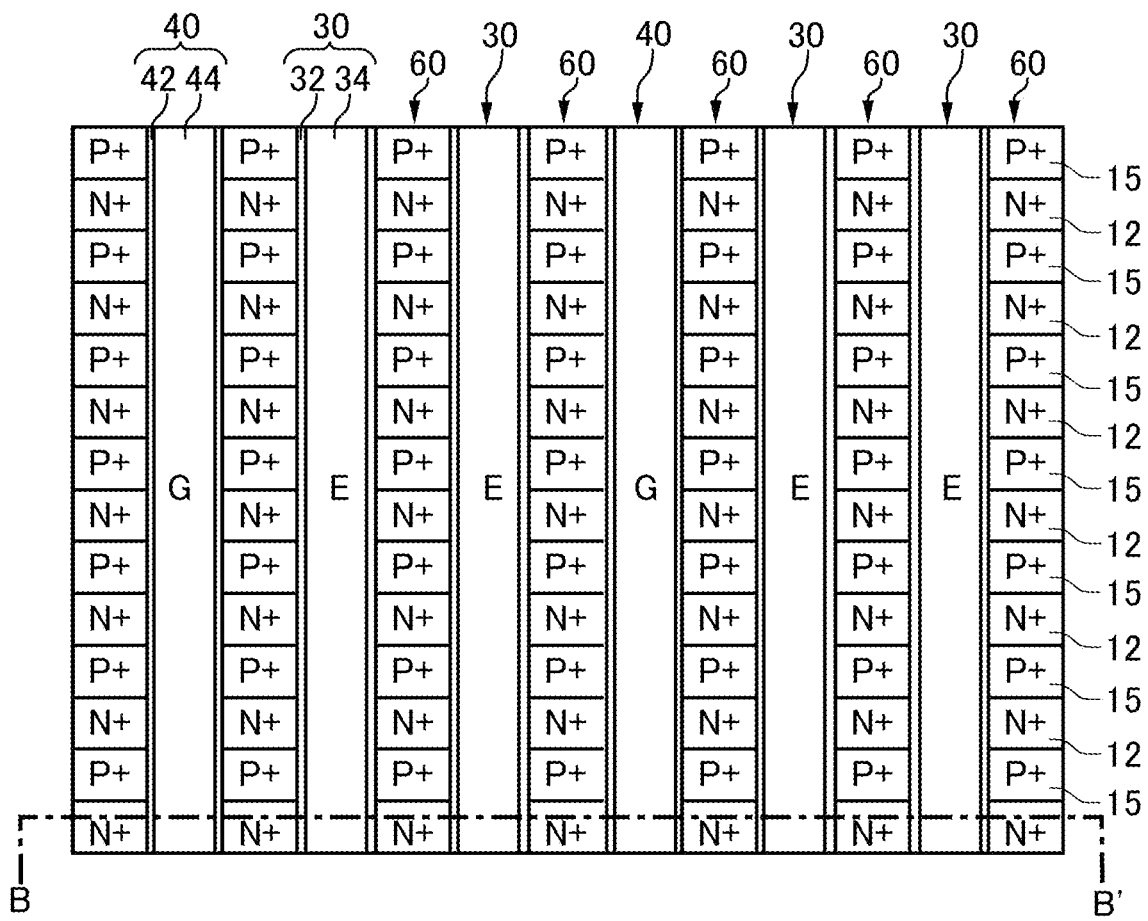
FIG. 1B illustrates an example of a top surface view of the semiconductor device 100 according to the embodiment.
Figure 1B:
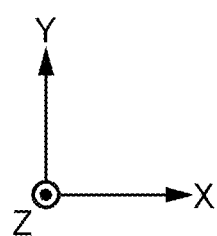

FIG. 1B illustrates an example of a top surface view of the semiconductor device 100 according to the embodiment. A B-B' cross-section in FIG. 1B corresponds to the cross-section view illustrated in FIG. 1A.

A contact region 15 is a second conductivity type region with a higher doping concentration than that of the base region 14. The contact regions 15 in the present example are of the P+ type as an example. The contact regions 15 in the present example are provided at the front surface 21 of mesa portions 60. The contact regions 15 in the present example are in contact with a dummy trench portion 30 and a gate trench portion 40.

In a mesa portion 60, the emitter regions 12 and the contact regions 15 are provided at the front surface 21 of the semiconductor substrate 10. Each emitter region 12 and contact region 15 is provided in contact with two trench portions adjacent to the mesa portion 60. The emitter regions 12 and the contact regions 15 are alternatingly provided in the extension direction. The emitter regions 12 and the contact regions 15 are provided at the same interval in the extension direction. However, the width of the emitter region 12 may be larger than or smaller than the width of the contact region 15 in the extension direction.

Contact holes 54 are provided extending in the extension direction. A contact hole 54 is formed above each of the emitter region 12 and the contact region 15. Note that the contact holes 54 and the insulating films between layers 26 are omitted in order for the drawing to be concise.

Figure 1C:
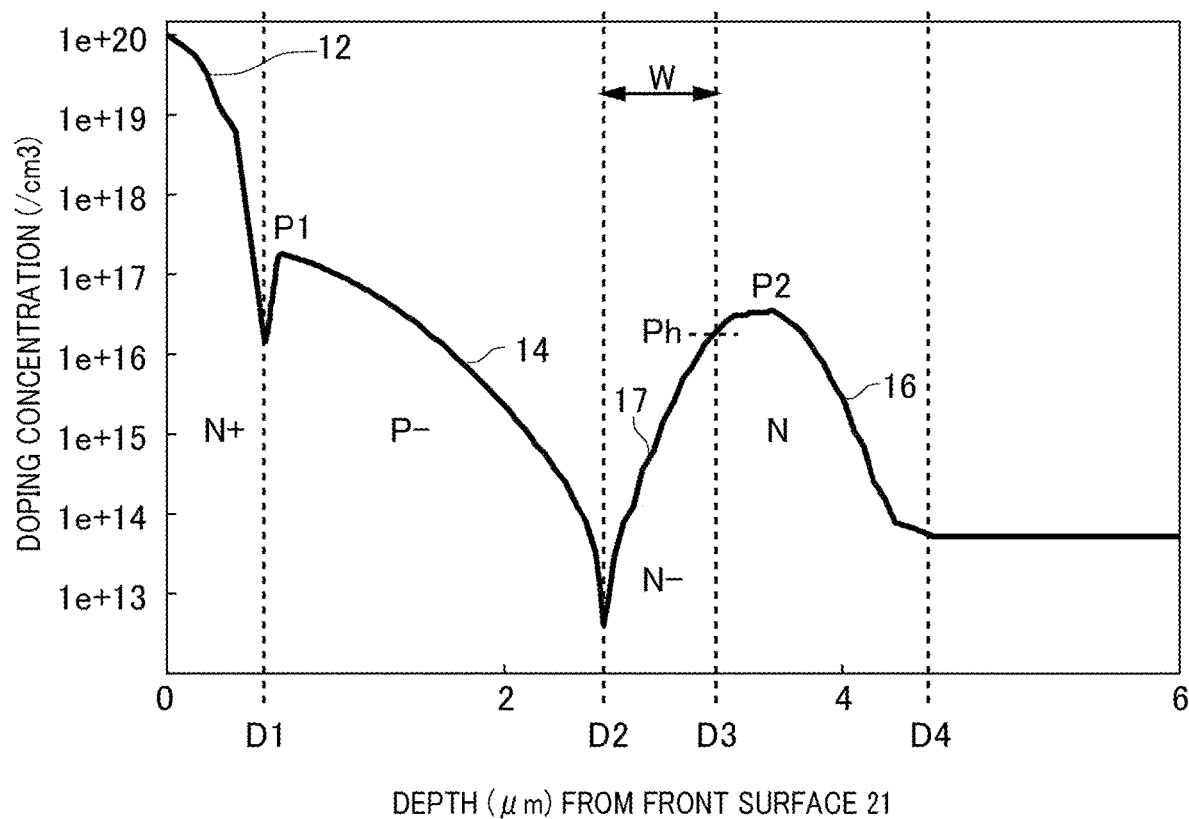
FIG. 1C illustrates an example of a doping concentration distribution in a depth direction of the semiconductor device 100 according to the embodiment.

FIG. 1C illustrates an example of a doping concentration distribution in a depth direction of the semiconductor device 100 according to the embodiment. The vertical axis indicates the doping concentration ($cm^{-3}$) with a logarithm scale, and the horizontal axis indicates the depth (μm) from the front surface 21 of the semiconductor substrate 10.

The doping concentration distribution in the present example indicates the doping concentration distribution in the A-A' cross-section of FIG. 1A. In other words, FIG. 1C illustrates the doping concentration distribution in the emitter region 12, the base region 14, the electric field relaxation region 17, the accumulation region 16, and the drift region 18, corresponding to the A-A' cross-section in FIG. 1A. Depths D1 through D4 are depths from the front surface 21 of the semiconductor substrate 10.

The depth D1 indicates the depth of the lower end of the emitter region 12, with reference to the front surface 21 of the semiconductor substrate 10. In other words, the depth D1 corresponds to the location of the boundary between the emitter region 12 and the base region 14. The depth D1 is the depth of a doping concentration distribution junction between the N type emitter region 12 and the P type base region 14. For example, the depth D1 is set to be within a range that is greater than or equal to 0.3 μm and less than or equal to 0.8 μm from the front surface 21 of the semiconductor substrate 10.

The doping concentration of the emitter region 12 shows a maximum value near the front surface 21 (that is, near a depth of 0 μm) of the semiconductor substrate 10. The maximum value of the doping concentration of the emitter region 12 may be greater than or equal to 1E20 cm$^{-3}$. Note that E means an exponent of 10, and for example 1E20 cm$^{-3}$ means 1×10$^{20}$ cm$^{-3}$.

The depth D2 indicates the depth of the lower end of the base region 14, with reference to the front surface 21 of the semiconductor substrate 10. In other words, the depth D2 corresponds to the location of a boundary between the base region 14 and the electric field relaxation region 17. The depth D2 is the depth of a doping concentration distribution junction between the P type base region 14 and the N type electric field relaxation region 17. For example, the depth D2 is set to be within a range that is greater than or equal to 1.5 μm and less than or equal to 2.5 μm from the front surface 21 of the semiconductor substrate 10.

A peak P1 of the doping concentration of the base region 14 is greater than or equal to 5E16 cm$^{-3}$ and less than or equal to 5E17 cm$^{-3}$. In the present embodiment, the peak P1 of the doping concentration of the base region 14 is provided in a range that is greater than or equal to 0.8 μm and less than or equal to 1.8 μm from the front surface 21 of the semiconductor substrate 10.

The depth D3 indicates the depth of the lower end of the electric field relaxation region 17, with reference to the front surface 21 of the semiconductor substrate 10. The depth D3 corresponds to the location of the boundary between the electric field relaxation region 17 and the accumulation region 16. The depth D3 of the present example is decided by setting a position in the doping concentration distribution for a half-value Ph for a peak P2 of the accumulation region 16 as the location of the boundary between the accumulation region 16 and the electric field relaxation region 17.

The doping concentration of the electric field relaxation region 17 is lower than the peak P1 of the doping concentration of the base region 14. The doping concentration of the electric field relaxation region 17 is also lower than the peak P2 of the doping concentration of the accumulation region 16. The electric field relaxation region 17 may have a region with the same doping concentration as that of the drift region 18. In this case, because the electric field relaxation region 17 can be a region where the drift region 18 remains, there is no necessity to additionally perform ion implantation for the electric field relaxation region 17. Accordingly, the manufacturing cost of the semiconductor device 100 is reduced.

The depth D4 indicates the depth of lower end of the accumulation region 16, with reference to the front surface 21 of the semiconductor substrate 10. The depth D4 corresponds to a depth where the concentration is the same as that of the drift region 18. For example, the depth D4 is arranged to be within a range that is greater than or equal to 2.5 μm and less than or equal to 5.0 μm from the front surface 21 of the semiconductor substrate 10. In the present embodiment, the drift region 18 has a roughly constant doping concentration. In the present embodiment, the doping concentration of the drift region 18 is greater than or equal to 5E13 cm$^{-3}$ and less than or equal to 5E14 cm$^{-3}$.

The doping concentration of the accumulation region 16 is lower than the peak P1 of the doping concentration of the base region 14. For example, the peak P2 of the doping concentration of the accumulation region 16 is greater than or equal to 1E16 cm$^{-3}$ and less than or equal to 4E16 cm$^{-3}$. In the present embodiment, the depth location where the doping concentration of the accumulation region 16 becomes a maximum is disposed within a range that is greater than or equal to 2.0 μm and less than or equal to 4.5 μm from the front surface 21 of the semiconductor substrate 10.

Figure 2A:
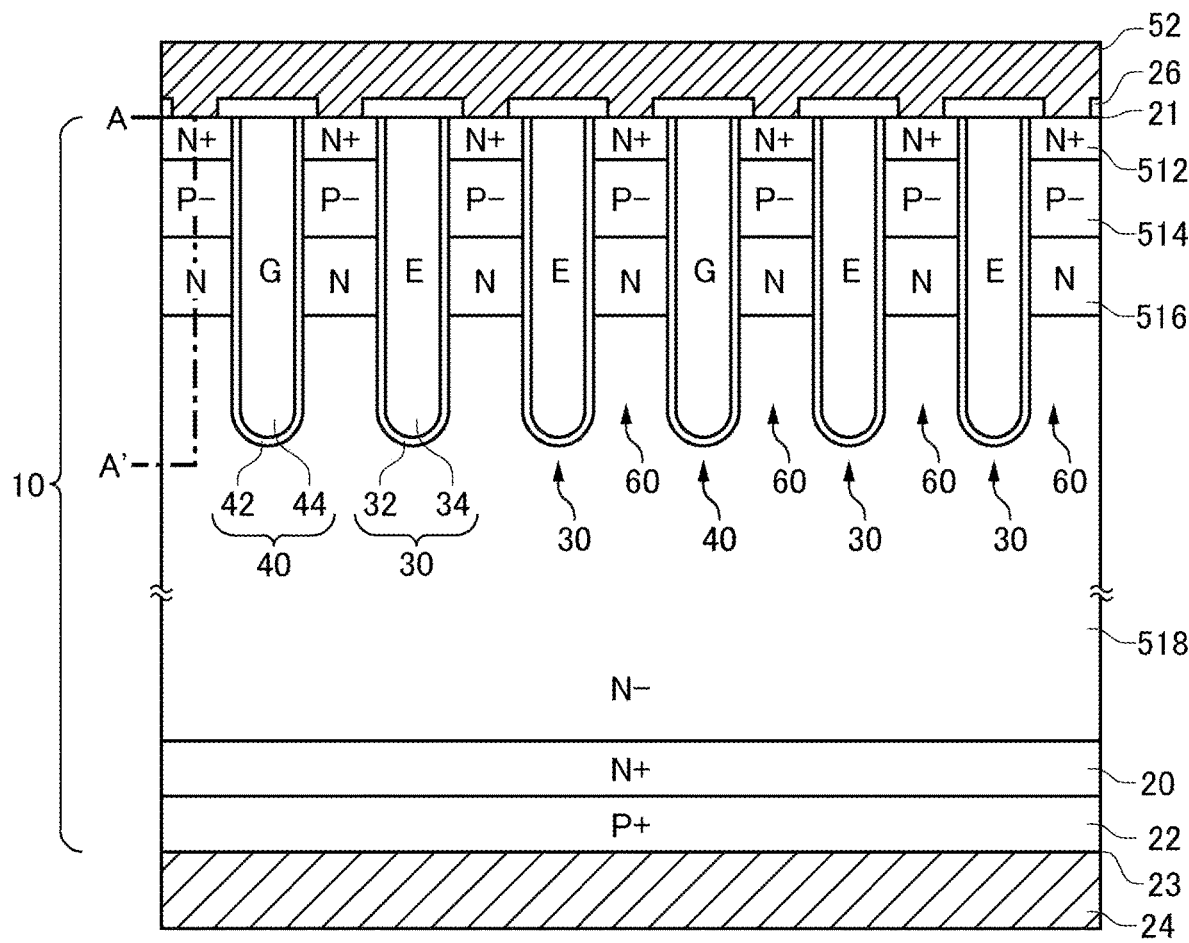
FIG. 2A illustrates an example of a cross-section of a semiconductor device 500 according to a comparative example.
Figure 2A:
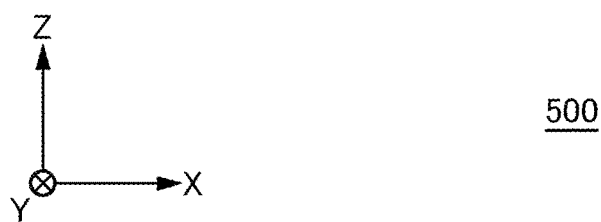

FIG. 2A illustrates an example of a cross-section of a semiconductor device 500 according to a comparative example. The semiconductor device 500 of the present example differs to the semiconductor device 100 according to the embodiment in not having the electric field relaxation region 17. The semiconductor device 500 has, in a mesa portion 60, an emitter region 512, a base region 514, an accumulation region 516, and a drift region 518. In the semiconductor device 500, the base region 514 and the accumulation region 516 are adjacently provided. Because the semiconductor device 500 does not have the electric field relaxation region 17, the electric field is concentrated between the base region 514 and the accumulation region 516.

For the semiconductor device 500, it is possible to, in accordance with the accumulation region 516, increase the IE effect, cause the amount of carriers accumulated in a steady state to increase, and reduce the ON voltage. Because it is possible to increase the IE effect the higher the concentration of the accumulation region 516, there is a tendency for the accumulation region 516 to be designed at a high concentration. However, when the peak of the doping concentration for the accumulation region 516 is a high concentration as with 1E16 cm$^{-3}$ or more, the leakage current may instantaneously increase between C-E.

Figure 2B:
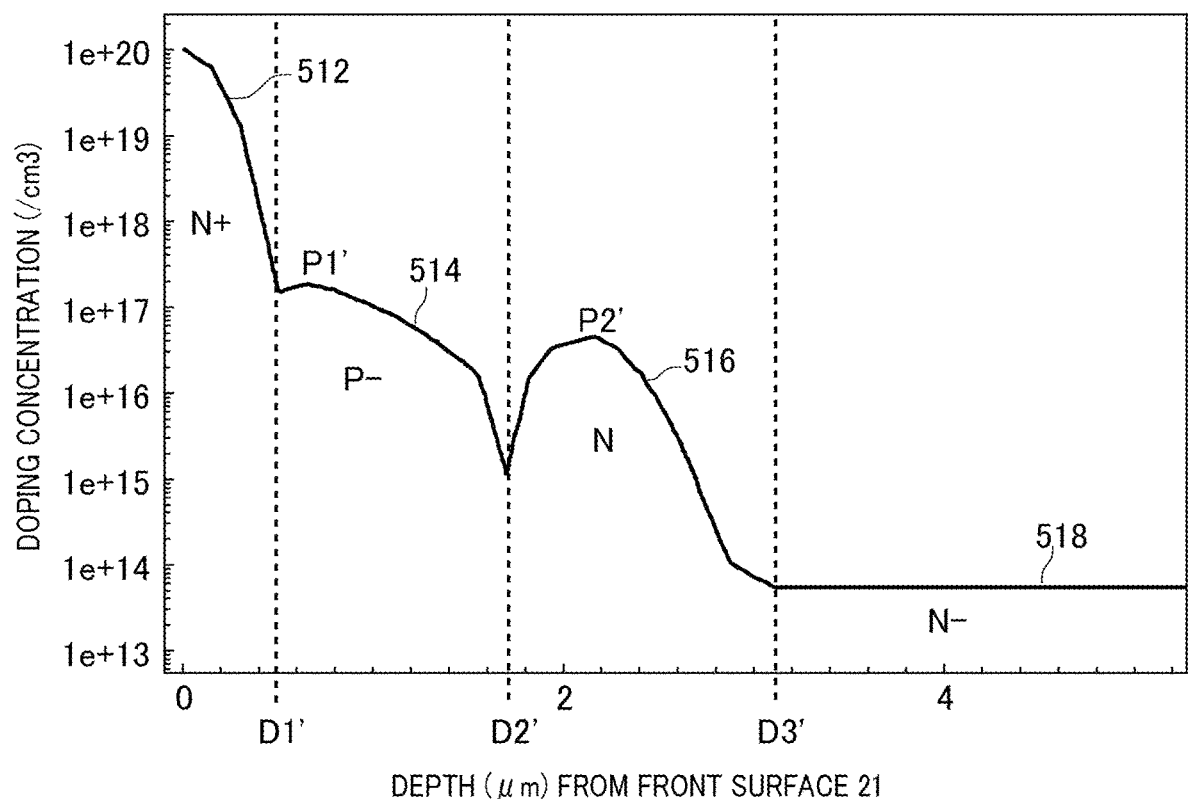
FIG. 2B illustrates an example of a doping concentration distribution in a depth direction of the semiconductor device 500 according to the comparative example.

FIG. 2B illustrates an example of a doping concentration distribution in a depth direction of the semiconductor device 500 according to the comparative example. The doping concentration distribution in the present example indicates the doping concentration distribution in the A-A' cross-section of FIG. 2A.

The depth D1' indicates the depth of the lower end of the emitter region 512, with reference to the front surface 21 of the semiconductor substrate 10. The depth D1' corresponds to the location of a boundary between the emitter region 512 and the base region 514. The depth D1' is the depth of a doping concentration distribution junction between the N type emitter region 512 and the P type base region 514.

A depth D2' indicates the depth of the lower end of the base region 514, with reference to the front surface 21 of the semiconductor substrate 10. The depth D2 corresponds to the location of a boundary between the base region 514 and the accumulation region 516. The depth D2' is the depth of a doping concentration distribution junction between the P type base region 514 and the N type accumulation region 516.

A depth D3' indicates the depth of lower end of the accumulation region 516, with reference to the front surface 21 of the semiconductor substrate 10. The depth D3' corresponds to a depth where the concentration of the drift region 518 is the same. A peak P2' of the doping concentration of the accumulation region 516 is 1E16 cm-3 or more. In the semiconductor device 500, the peak P2' of the doping concentration of the accumulation region 516 is lower than a peak P1' of the doping concentration of the base region 514.

In this manner, at the interface where the P type base region 514 and the N type accumulation region 516 are in direct contact, the carrier density is increased by the accumulation region 516, and the electric field is more likely to be concentrated. When the electric field is concentrated, a leakage current between C-E is more likely to occur.

Figure 2C:
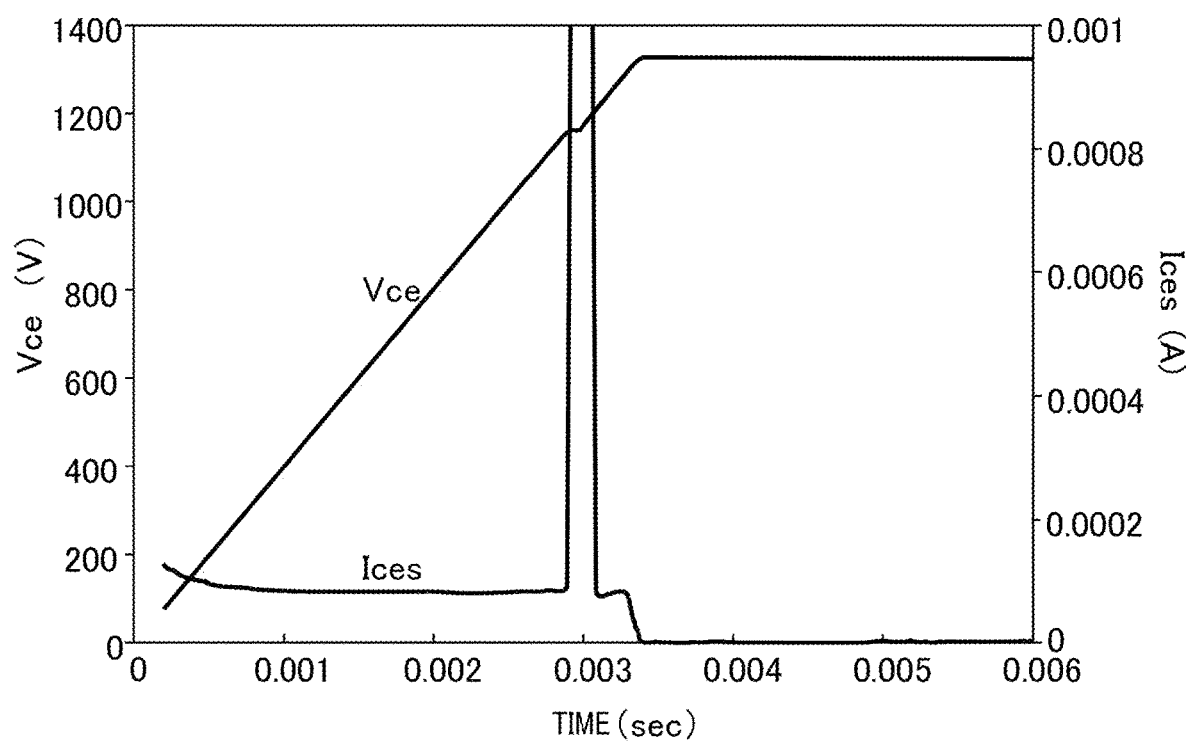
FIG. 2C illustrates a measured waveform of a current Ices of the semiconductor device 500 according to the comparative example.

FIG. 2C illustrates a measured waveform of a current Ices of the semiconductor device 500 according to the comparative example. The vertical axis indicates the voltage Vce (V) between C-E and the current Ices (A) between C-E, and the horizontal axis indicates time (sec). In the present example, FIG. 2C illustrates change in the current Ices when the voltage Vce is swept at a predefined sweep speed.

The voltage Vce is swept at a speed of dv/dt=0.4 kV/ms, from 0 V to 1330 V. When the voltage Vce rises, the current Ices instantaneously rises at a predefined voltage. For example, the instantaneous increase in the leakage current between C-E is where the peak concentration of the accumulation region 516 is 1E16 cm$^{-3}$ or more, and occurs due to the electric field concentrating at the interface between the base region 514 and the accumulation region 516. The Voltage Vce which increases the leakage current may be related to the voltage for where the depletion layer reaches the buffer region 20. By the depletion layer reaching the buffer region 20, the electric field ceases to apply further in the depth direction, and the leakage current increases by the electric field on the front surface 21 side suddenly increasing. The peak concentration here indicates the peak doping concentration.

Figure 2D:
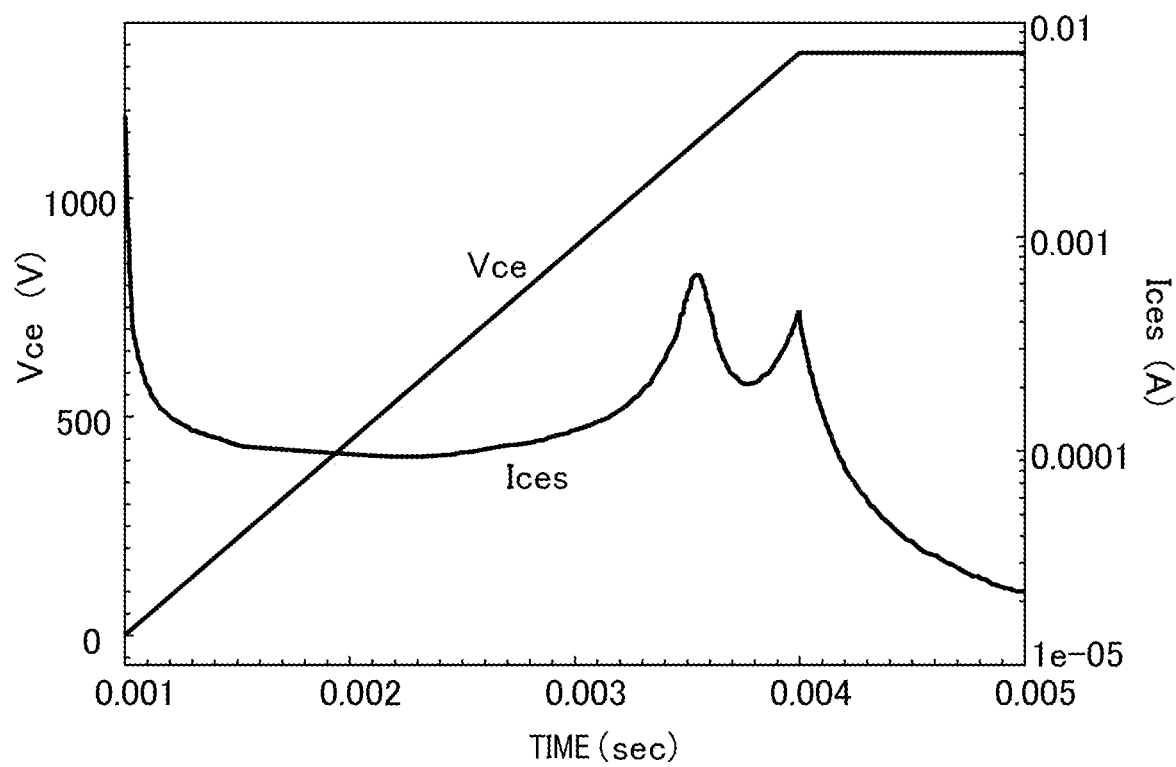
FIG. 2D illustrates a simulated waveform of the current Ices of the semiconductor device 500 according to the comparative example.

FIG. 2D illustrates a simulated waveform of the current Ices of the semiconductor device 500 according to the comparative example. The vertical axis indicates the voltage Vce (V) between C-E and the current Ices (A) between C-E, and the horizontal axis indicates time (sec). In the present example, the voltage Vce is swept under the same conditions as the sweep conditions of FIG. 2C. Similarly to the case in FIG. 2C, a phenomenon in which the current Ices instantaneously increases accompanying an increase of the voltage Vce is confirmed.

In contrast, the semiconductor device 100, by providing the electric field relaxation region 17, enables the IE effect to be increased while suppressing an increase of the leakage current between C-E that occurs when the accumulation region 16 is made to have a high concentration. As a result, loss due to the leakage current between C-E is reduced. However, because the IE effect decreases when the film thickness W of the electric field relaxation region 17 is made to be too large, an appropriate film thickness W for the electric field relaxation region 17 is selected in accordance with the peak concentration of the accumulation region 16.

Figure 3A:
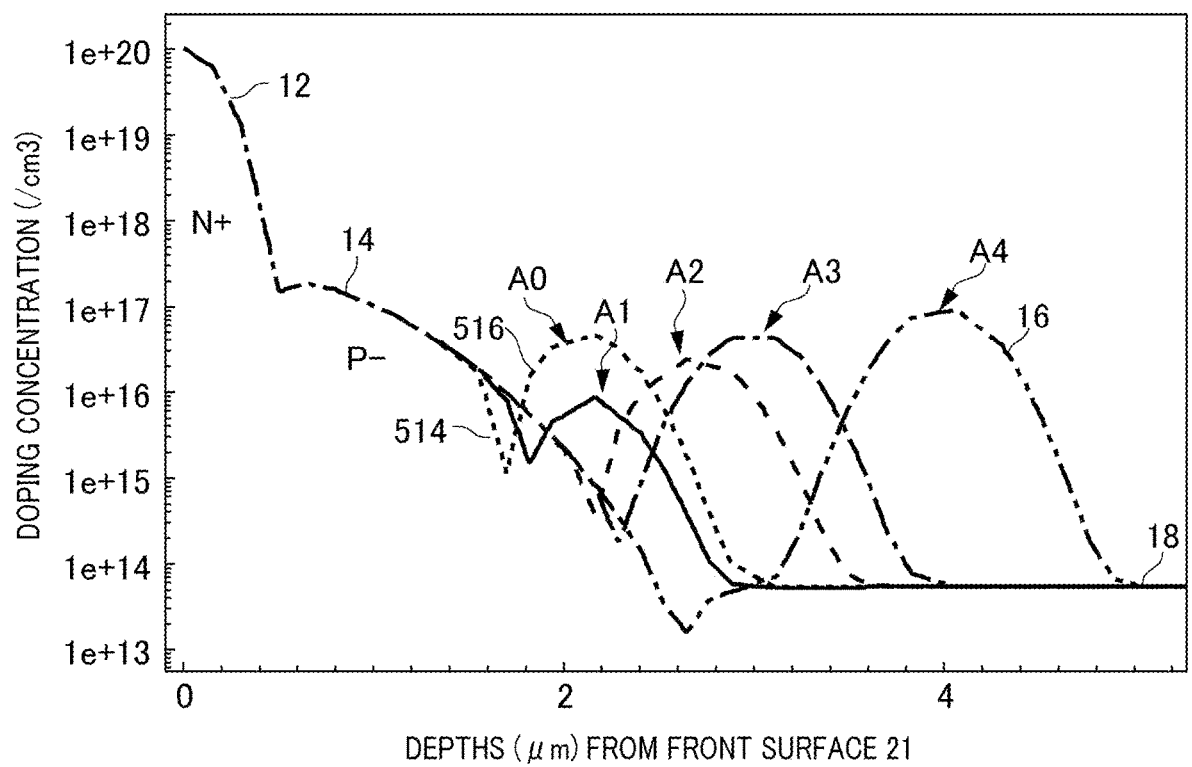
FIG. 3A illustrates an example of a doping concentration distribution of an electric field relaxation region 17.

FIG. 3A illustrates an example of a doping concentration distribution of the electric field relaxation region 17. The electric field relaxation region 17 of the present example is changed to four different doping concentration distributions, A1 through A4, by changing conditions. A doping concentration distribution A0 is also illustrated for the semiconductor device 500 for comparison.

The doping concentration distribution A0 indicates the doping concentration distribution of the semiconductor device 500 which does not have the electric field relaxation region 17. In the present example, the base region 514 is in contact with the accumulation region 516. The peak concentration of the accumulation region 516 is lower than the peak concentration of the base region 514.

The doping concentration distributions A1 through A4 indicate doping concentration distributions for the semiconductor device 100 which has the electric field relaxation region 17 with respectively predefined film thicknesses. The doping concentration distributions A1 through A4 indicate doping concentration distributions for when the film thickness W of the electric field relaxation region 17 is increased in this order. By increasing the film thickness W of the electric field relaxation region 17, it is possible to increase the peak concentration of the accumulation region 16. By increasing the peak concentration of the accumulation region 16, it is possible to improve the IE effect and reduce the ON voltage.

Figure 3B:
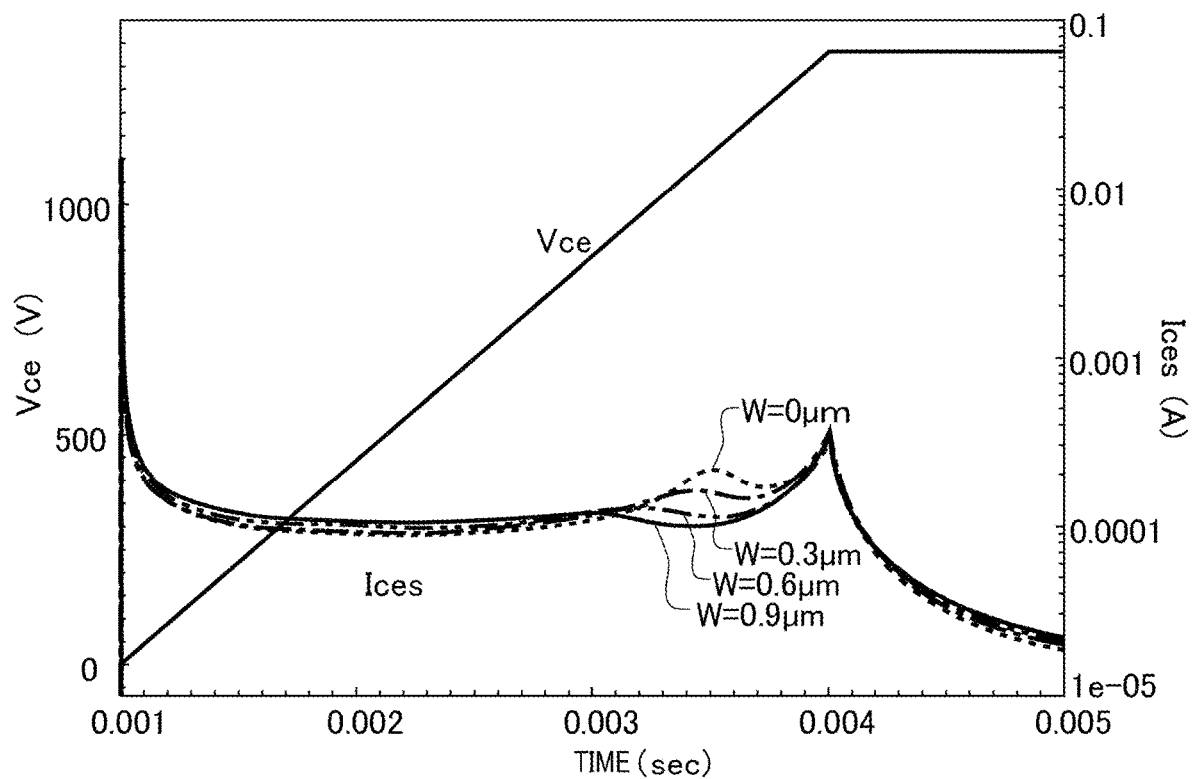
FIG. 3B illustrates change of the current Ices in accordance with a film thickness W of the electric field relaxation region 17.

FIG. 3B illustrates change of the current Ices in accordance with the film thickness W of the electric field relaxation region 17. In the present example, the film thickness W of the electric field relaxation region 17 is changed to 0 μm, 0.3 μm, 0.6 μm, or 0.9 μm. The greater the film thickness W of the electric field relaxation region 17, the easier it is for the depletion layer to extend in the depth direction, and the greater the electric field relaxation effect. Accordingly, a rise of the current Ices is suppressed in accordance with the film thickness W of the electric field relaxation region 17 increasing.

Figure 4A:
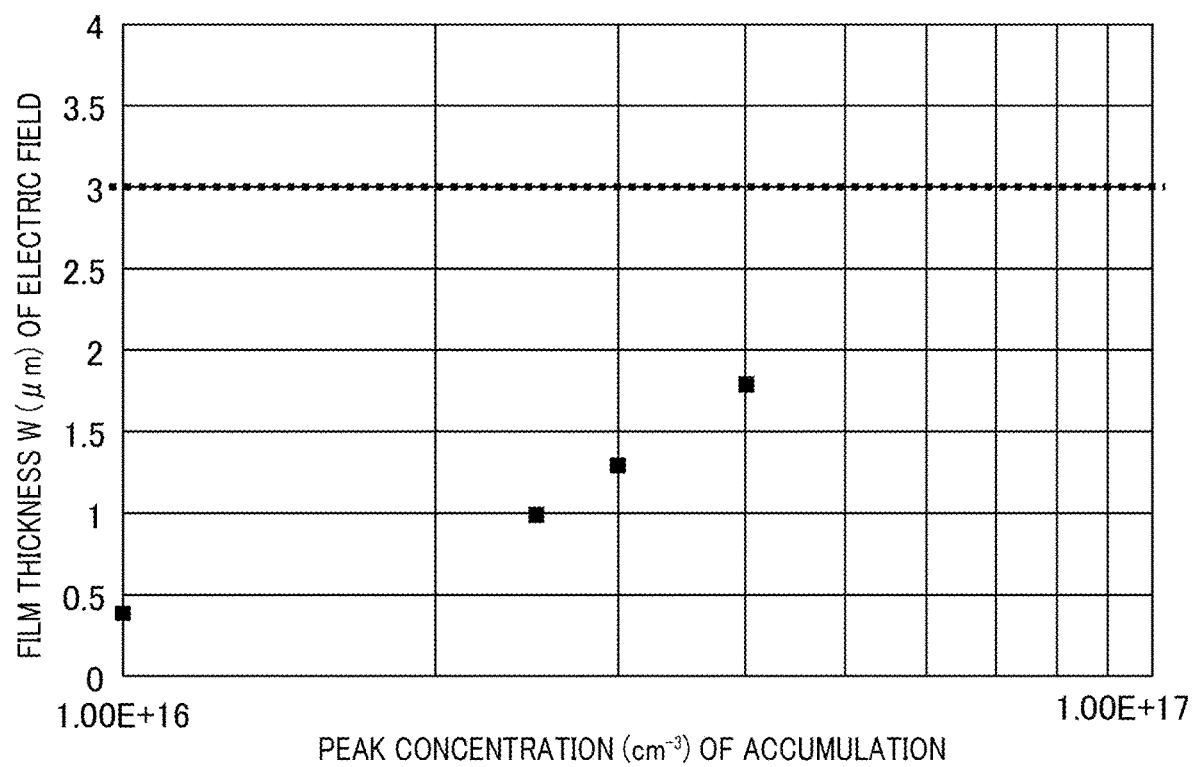
FIG. 4A illustrates a relationship between the peak concentration of an accumulation region 16 and the film thickness W of the electric field relaxation region 17.

FIG. 4A illustrates a relationship between a peak concentration of the accumulation region 16 and the film thickness W of the electric field relaxation region 17. The vertical axis indicates the film thickness W (μm) of the electric field relaxation region 17, and the horizontal axis indicates the peak concentration (cm$^{-3}$) of the accumulation region 16. In the present example, illustration is given for the film thickness W of the electric field relaxation region 17 that is necessary in order to relax the electric field in accordance with the peak concentration of the accumulation region 16.

The size of the film thickness W of the electric field relaxation region 17 that is necessary to suppress the leakage current differs in accordance with the peak concentration of the accumulation region 16. In the electric field relaxation region 17, it is possible to make it easier for the depletion layer to expand and relax concentration of the electric field. The thicker the film thickness W of the electric field relaxation region 17, the higher an effect by which the electric field is relaxed and the leakage current is suppressed.

The higher the peak concentration of the accumulation region 16, the less likely it is for the depletion layer to expand, and thus the electric field is likely to be concentrated. The lower the doping concentration of the accumulation region 16, the more likely it is for the depletion layer to expand, and the more likely it is for the electric field to be dispersed. Accordingly, the greater the peak concentration of the accumulation region 16, the greater the film thickness W of the electric field relaxation region 17 that is necessary in order to suppress the leakage current.

For example, the doping concentration of the accumulation region 16 is greater than or equal to 1E16 cm$^{-3}$ and less than or equal to 4E16 cm$^{-3}$. When the doping concentration of the accumulation region 16 is 1E16 cm$^{-3}$, the film thickness W of the electric field relaxation region 17 is 0.4 μm. When the doping concentration of the accumulation region 16 is 2.5E16 cm$^{-3}$, the film thickness W of the electric field relaxation region 17 is 1.0 μm. When the doping concentration of the accumulation region 16 is 3E16 cm$^{-3}$, the film thickness W of the electric field relaxation region 17 is 1.3 μm. When the doping concentration of the accumulation region 16 is 4E16 cm$^{-3}$, the film thickness W of the electric field relaxation region 17 is 1.8 μm.

When the film thickness W of the electric field relaxation region 17 is too thick, the accumulation region 16 may be present at a deep location that is the trench bottom, and thus a drop in the breakdown voltage occurs. Accordingly, a drop of the breakdown voltage is suppressed by making the film thickness W of the electric field relaxation region 17 be 3.0 μm or less. Note that the film thickness W of the electric field relaxation region 17 may be thicker than the values in the present example.

Figure 4B:
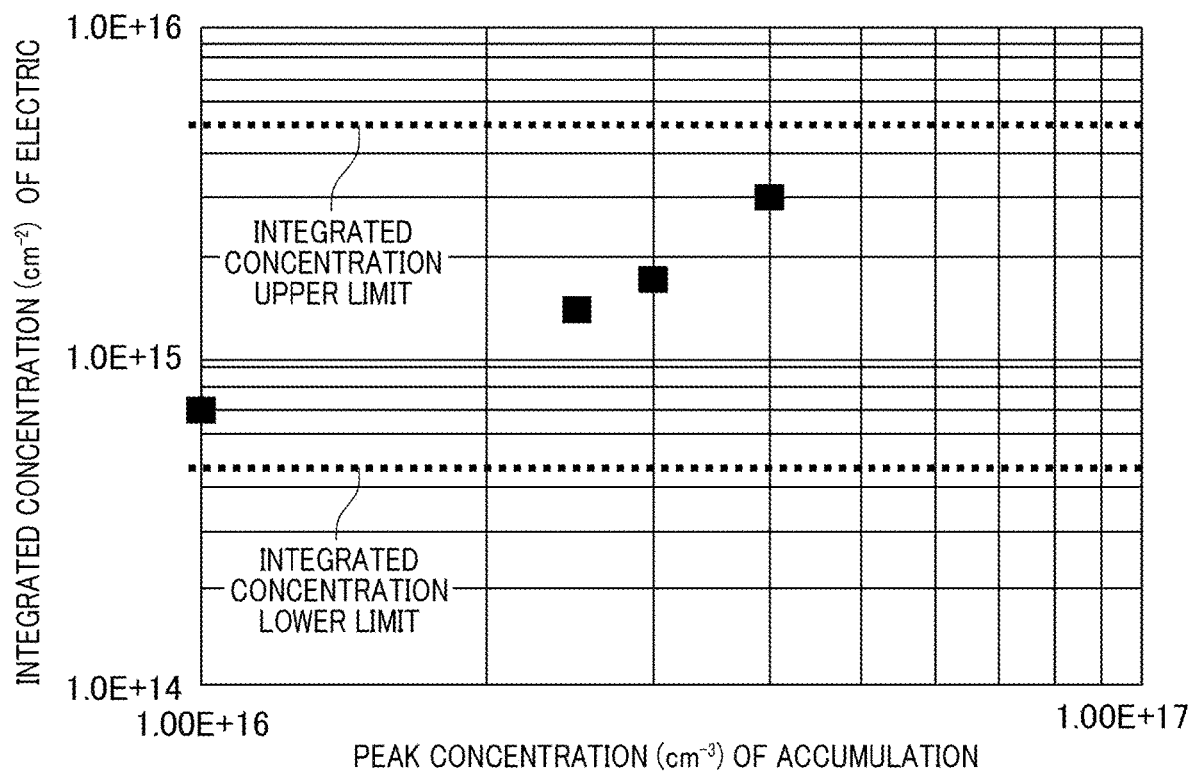
FIG. 4B illustrates a relationship between the peak concentration of the accumulation region 16 and an integrated concentration of the electric field relaxation region 17.

FIG. 4B illustrates a relationship between the peak concentration of the accumulation region 16 and an integrated concentration of the electric field relaxation region 17. The vertical axis indicates the integrated concentration (cm$^{-2}$) of the electric field relaxation region 17, and the horizontal axis indicates the peak concentration (cm$^{-3}$) of the accumulation region 16. The integrated concentration of the electric field relaxation region 17 indicates a value calculated by integrating the doping concentration distribution within the range of the film thickness W of the electric field relaxation region 17.

For example, the integrated concentration of the electric field relaxation region 17 is greater than or equal to 5E14 cm$^{-2}$ and less than or equal to 5E15 cm$^{-2}$. By appropriately setting the integrated concentration of the electric field relaxation region 17, the electric field between the base region 14 and the electric field relaxation region 17 is relaxed, and it is possible to suppress the leakage current. The leakage current indicates the leakage current for the current Ices that flows between the collector electrode 24 and the emitter electrode 52.

FIG. 4C illustrates a relationship between the peak concentration of the accumulation region 16, the film thickness W of the electric field relaxation region 17, and the integrated concentration of the electric field relaxation region 17.

A film thickness W of the electric field relaxation region 17 is set so that it is possible to suppress a leakage current between C-E when a high voltage is applied. In one example, the film thickness W of the electric field relaxation region 17 is set so that the electric field between the accumulation region 16 and the base region 14 is relaxed, and the leakage current is suppressed.

For example, the film thickness W of the electric field relaxation region 17 is greater than or equal to the film thickness of the accumulation region 16. By thickening the film thickness of the electric field relaxation region 17, it is easier to suppress the leakage current. The film thickness W of the electric field relaxation region 17 may be less than or equal to the film thickness of the accumulation region 16. The film thickness W of the electric field relaxation region 17 may be greater than or equal to 0.4 μm and less than or equal to 3.0 μm. The film thickness W of the electric field relaxation region 17 may be greater than or equal to 1.0 μm and less than or equal to 1.8 μm. The film thickness W of the electric field relaxation region 17 may be greater than or equal to 1.5 μm and less than or equal to 2.0 μm. Furthermore, the integrated concentration of the electric field relaxation region 17 may be greater than or equal to 5E14 cm$^{-2}$ and less than or equal to 5E15 cm$^{-2}$.

Figure 5:
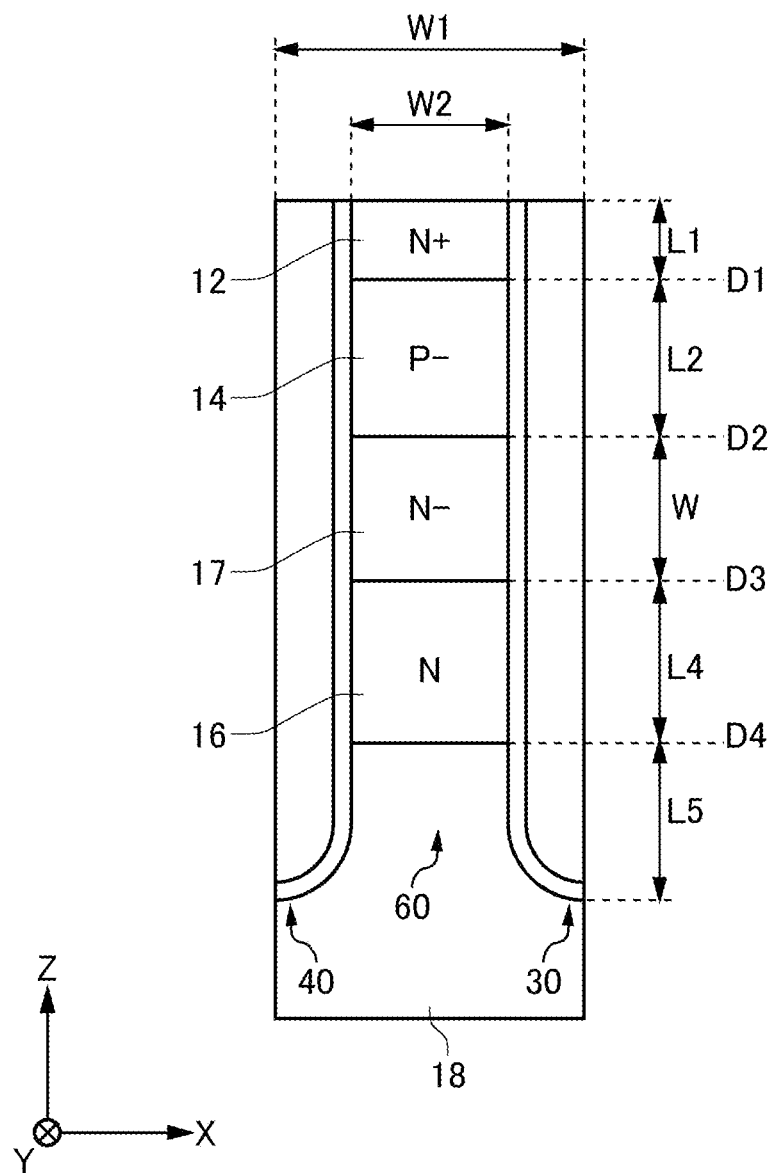
FIG. 5 illustrates an example of an enlarged view of a cross-section view of the semiconductor device 100 according to embodiment.

FIG. 5 illustrates an example of an enlarged view of a cross-section view of the semiconductor device 100 according to embodiment. This drawing is an enlarged view of a mesa portion 60 sandwiched between an adjacent dummy trench portion 30 and an adjacent gate trench portion 40.

A width W1 indicates the interval between the center of the dummy trench portion 30 and the center of the gate trench portion 40. In other words, the width W1 is the pitch of the trench portions. A width W2 indicates the width of the mesa portion 60.

A length L1 is the film thickness of the emitter region 12. The length L1 corresponds to the film thickness from the front surface 21 of the semiconductor substrate 10 to the depth D1. For example, the length L1 is greater than or equal to 0.3 μm and less than or equal to 0.8 μm.

A length L2 is the film thickness of the base region 14. The length L2 corresponds to the film thickness from the depth D1 to the depth D2.

A length W is the film thickness of the electric field relaxation region 17. The length W corresponds to the film thickness from the depth D2 to the depth D3. For example, the length W is greater than or equal to 0.4 μm and less than or equal to 3.0 μm.

A length L4 is the film thickness of the accumulation region 16. The length L4 corresponds to the film thickness from the depth D3 to the depth D4. In one example, the film thickness of the accumulation region 16 is greater than or equal to 0.5 μm and less than or equal to 1.5 μm. For example, the film thickness of the accumulation region 16 is 1.0 μm.

A length L5 is the distance from the lower end D4 of the accumulation region 16 to the lower end of the dummy trench portion 30 or the gate trench portion 40 which protrude on the lower side beyond the bottom surface of the accumulation region 16. It is desirable that the accumulation region 16 has a film thickness of a level so as to not go beyond the lower end of the dummy trench portion 30 or the gate trench portion 40.

In a semiconductor device that has trench portions, the density of holes implanted from a collector in accordance with conductivity modulation decreases as the emitter is approached. As a result, the carrier density becomes lower on the emitter side, and it is not possible to make the ON resistance be sufficiently low. By the semiconductor device 100 of the present example providing the accumulation region 16 below the base region 14, it is possible to improve the carrier density on the emitter side.

In this manner, by increasing the maximum value of the doping concentration in the accumulation region 16, it is possible to decrease the ON resistance and the ON voltage of the semiconductor device 100. In contrast, when the total dose amount in the accumulation region 16 becomes too large, the electric field between the base region 14 and the accumulation region 16 becomes large and thus a leakage current occurs. Accordingly, it is desirable for the film thickness W of the electric field relaxation region 17 to be set in a range that enables the electric field between the base region 14 and the accumulation region 16 to be sufficiently relaxed.

In one example, it is desirable for the film thickness W of the electric field relaxation region 17 to be smaller than the length L4 which is the film thickness of the accumulation region 16. The film thickness W of the electric field relaxation region 17 is also less than or equal to the total of L1+L2 which is the lengths of the emitter region 12 and the base region 14. The film thickness W of the electric field relaxation region 17 may be less than or equal to the length L2 of the base region 14. The film thickness W of the electric field relaxation region 17 may be less than or equal to the length L5 of the protruding section of the gate trench portion 40 or may be less than or equal to half of L5.

Meanwhile, by having the accumulation region 16 be a low doping concentration, it is easier for the depletion layer to expand, and it is possible to relax concentration of the electric field. Even in this case, an electric field relaxation region 17 that is greater than or equal to 0.4 μm may be provided.

Figure 6:
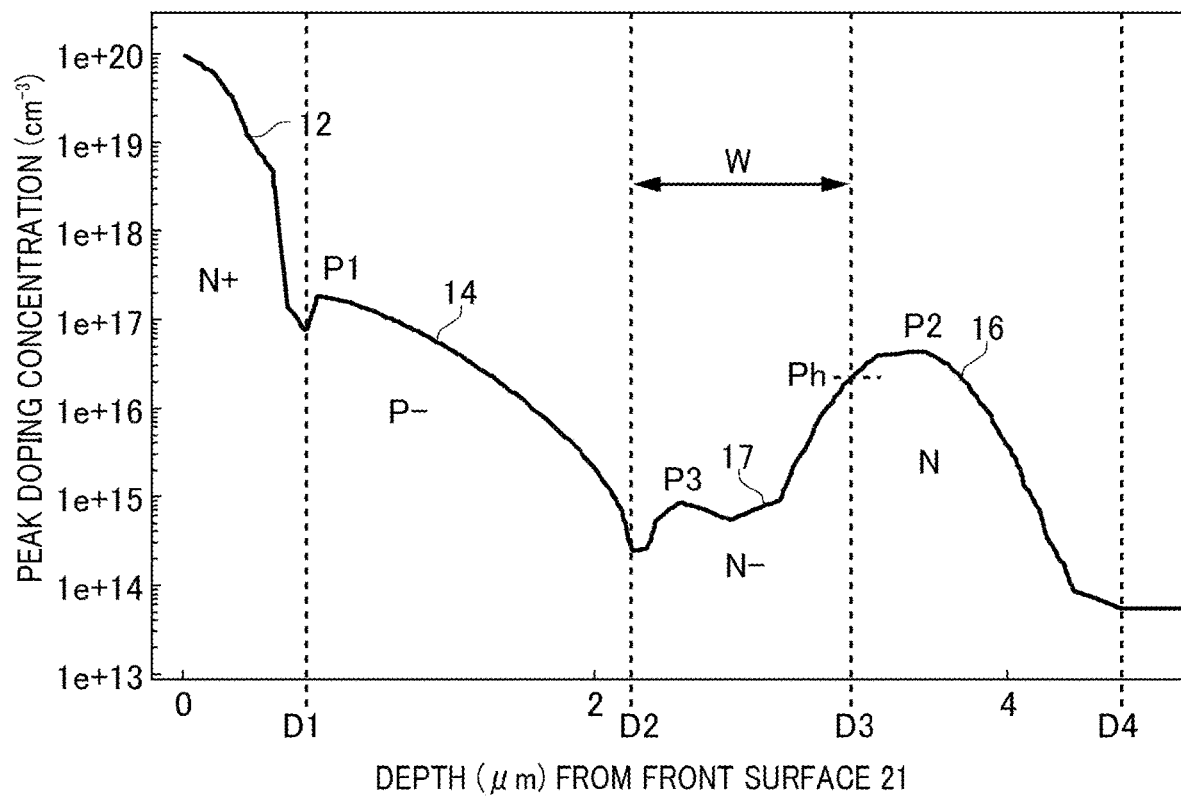
FIG. 6 illustrates another example of a doping concentration distribution in the depth direction of the semiconductor device 100 according to the embodiment.

FIG. 6 illustrates another example of a doping concentration distribution in the depth direction of the semiconductor device 100 according to the embodiment. The semiconductor device 100 of the present example has a peak P3 in the electric field relaxation region 17.

The peak P3 is provided in the electric field relaxation region 17. The peak P3 is lower than the half-value Ph of the peak P2. It is sufficient if the doping concentration of the electric field relaxation region 17 is a value that is lower than the half-value Ph of the peak P2 of the accumulation region 16. The electric field relaxation region 17 may have a plurality of stepped peaks. Even in this case, each stepped concentration of the electric field relaxation region 17 which is formed with a plurality of steps may have any value as long as it is a value that is less than the half-value Ph of the peak P2 of the accumulation region 16. For example, toward the back surface 23 of the semiconductor substrate 10, the doping concentration of the electric field relaxation region 17 may gradually increase or may gradually decrease. It is sufficient if the profile of the doping concentration is that the integrated concentration of the electric field relaxation region 17 is greater than or equal to 5E14 $cm^{-2}$ and less than or equal to 5E15 $cm^{-2}$, but there is no limitation to this.

The present invention is described above using an embodiment, but the technical scope of the present invention is not limited to the scope of what is set forth in the embodiment above. That it is possible to add various modifications or improvements to the embodiment described above is obvious to a person skilled in the art. That an embodiment to which these various modifications or improvements have been added to can still be included in the technical scope of the present invention is obvious from what is set forth in the claims.

EXPLANATION OF REFERENCES

10: semiconductor substrate, 12: emitter region, 14: base region, 15: contact region, 16: accumulation region, 17: electric field relaxation region, 18: drift region, 20: buffer region, 21: front surface, 22: collector region, 23: back surface, 24: collector electrode, 26: insulating film between layers, 30: dummy trench portion, 32: dummy insulating film, 34: dummy conductive portion, 40: gate trench portion, 42: gate insulating film, 44: gate conductive portion, 52: emitter electrode, 54: contact hole, 60: mesa portion, 100: semiconductor device, 500: semiconductor device, 512: emitter region, 514: base region, 516: accumulation region, 518: drift region

What is claimed is:

1. A semiconductor device, comprising:
   a drift region that is of a first conductivity type and is provided in a semiconductor substrate;
   a base region that is of a second conductivity type and is provided above the drift region; and
   an accumulation region that is of the first conductivity type, is provided between the base region and the drift region, and has a higher doping concentration than the drift region,
   wherein
   the semiconductor device has a doping concentration distribution in a depth direction of the semiconductor device in which a film thickness of an electric field relaxation region that is of the first conductivity type is greater than or equal to 0.4 μm and less than or equal to 3.0 μm, the electric field relaxation region being a region from a location of a PN junction at a lower end of the base region to a location of a half-value of a peak of the accumulation region on the base region side.

2. The semiconductor device according to claim 1, wherein the semiconductor device has the doping concentration distribution in which the film thickness of the electric field relaxation region is greater than or equal to 1.0 μm and less than or equal to 1.8 μm.

3. The semiconductor device according to claim 1, wherein the semiconductor device has the doping concentration distribution in which the film thickness of the electric field relaxation region is greater than or equal to 1.5 μm and less than or equal to 2.0 μm.

4. The semiconductor device according to claim 1, wherein the drift region is a remaining region having a doping concentration of the semiconductor substrate.

5. The semiconductor device according to claim 1, wherein the semiconductor device has the doping concentration distribution in which the film thickness of the electric field relaxation region is less than or equal to a film thickness of the accumulation region.

6. The semiconductor device according to claim 1, wherein the semiconductor device has the doping concentration distribution in which the electric field relaxation region includes a peak that is less than the half-value of the peak of the accumulation region.

7. The semiconductor device according to claim 1, wherein the peak of the accumulation region is a maximum value of the doping concentration of the accumulation region in the doping concentration distribution.

8. A semiconductor device, comprising:
   a drift region that is of a first conductivity type and is provided in a semiconductor substrate;
   a base region that is of a second conductivity type and is provided above the drift region; and
   an accumulation region that is of the first conductivity type, is provided between the base region and the drift region, and has a higher doping concentration than the drift region, wherein
   the semiconductor device has a doping concentration distribution in a depth direction of the semiconductor device in which a distance from a location of a PN junction at a lower end of the base region to a location of a half-value of a maximum value of the doping concentration of the accumulation region on the base region side is greater than or equal to 0.4 μm and less than or equal to 3.0 μm.

9. The semiconductor device according to claim 1, comprising trench portions that are arrayed in a predefined array direction in a front surface of the semiconductor substrate, the trench portions including a gate trench portion and a dummy trench portion.

10. The semiconductor device according to claim 9, wherein the gate trench portion and the dummy trench portion are repeatedly arrayed in a predefined pattern in the array direction.

11. The semiconductor device according to claim 9, wherein the doping concentration distribution is a doping concentration distribution in a first mesa portion sandwiched between the gate trench portion and the dummy trench portion in the array direction.

12. The semiconductor device according to claim 9, wherein the doping concentration distribution is a doping concentration distribution in a second mesa portion sandwiched between two dummy trench portions in the array direction.

13. The semiconductor device according to claim 9, comprising:
   an emitter region that is of the first conductivity type and is provided in the front surface side of the semiconductor substrate than the base region, and has a higher doping concentration than the accumulation region;
   a contact region that is of the second conductivity type and is provided in the front surface side of the semiconductor substrate than the base region, and has a higher doping concentration than the base region.

14. The semiconductor device according to claim 13, wherein the location of the PN junction at the lower end of the base region in the doping concentration distribution is located within a range that is greater than or equal to 1.5 μm and less than or equal to 2.5 μm from the front surface of the semiconductor substrate.

15. The semiconductor device according to claim 14, wherein a lower end of the accumulation region in the doping concentration distribution is located within a range that is greater than or equal to 2.5 μm and less than or equal to 5.0 μm from the front surface of the semiconductor substrate.

16. The semiconductor device according to claim 8, wherein the maximum value of the doping concentration of the accumulation region in the doping concentration distribution is located within a range that is greater than or equal to 2.0 μm and less than or equal to 4.5 μm from the front surface of the semiconductor substrate.

17. The semiconductor device according to claim 1, wherein the doping concentration of the accumulation region in the doping concentration distribution is lower than a maximum value of a doping concentration of the base region.

18. The semiconductor device according to claim 1, wherein the semiconductor device has the doping concentration distribution in which a film thickness of the accumulation region is greater than or equal to 0.5 μm and less than or equal to 1.5 μm.

\* \* \* \* \*